United States Patent
Wei et al.

(10) Patent No.: US 6,652,763 B1
(45) Date of Patent: Nov. 25, 2003

(54) METHOD AND APPARATUS FOR LARGE-SCALE DIAMOND POLISHING

(75) Inventors: Ronghua Wei, Calabasas, CA (US); Daniel J. Gregoire, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/541,178

(22) Filed: Apr. 3, 2000

(51) Int. Cl.[7] .............................. B44C 1/22; C23F 1/00; H01L 21/00
(52) U.S. Cl. .............................. 216/67; 216/70; 216/81; 156/345.42; 118/723 ER; 118/723 ME; 118/723 E
(58) Field of Search .............................. 216/67, 70, 81; 118/723 ME, 723 ER, 723 E; 156/345.42

(56) References Cited

U.S. PATENT DOCUMENTS

| | | | |
|---|---|---|---|
| 4,123,316 A | * 10/1978 | Tsuchimoto | ......... 118/723 MA |
| 4,483,737 A | * 11/1984 | Mantei | ........................ 156/345 |
| 4,699,689 A | * 10/1987 | Bersin | ........................ 438/709 |
| 5,114,529 A | * 5/1992 | Masuyama et al. | ... 118/723 ER |
| 5,154,023 A | 10/1992 | Siosanshi | |
| 5,160,405 A | * 11/1992 | Miyauchi et al. | ...... 204/192.32 |
| 5,417,798 A | * 5/1995 | Nishibayashi et al. | ...... 156/345 |
| 5,500,077 A | * 3/1996 | Nishibayashi et al. | ........ 216/38 |
| 5,517,084 A | * 5/1996 | Leung | ................... 315/111.21 |
| 5,641,702 A | * 6/1997 | Imai et al. | .................... 438/240 |
| 5,888,414 A | * 3/1999 | Collins et al. | .............. 156/345 |
| 5,911,852 A | * 6/1999 | Katayama et al. | ... 118/723 ME |
| 6,013,191 A | * 1/2000 | Nasser-Faili et al. | .. 204/192.34 |
| 6,016,036 A | * 1/2000 | Brailove | ................. 250/423 R |

FOREIGN PATENT DOCUMENTS

| | | |
|---|---|---|
| EP | 0496564 | 7/1992 |
| GB | 2244958 A | 12/1991 |
| JP | 08017801 A | 1/1996 |

OTHER PUBLICATIONS

Grot S A et al, "Oxygen Based Electron Cyclotron Resonance Etching of Semiconducting Homoepitaxial Diamond Films", Appliedc Physics Letters, American Institute of Physics, New York, US, vol. 61, No. 19, Nov. 9, 1992 pp 2326–2328.

\* cited by examiner

*Primary Examiner*—Benjamin L. Utech
*Assistant Examiner*—Shamim Ahmed
(74) *Attorney, Agent, or Firm*—Tope-Mckay & Associates

(57) ABSTRACT

A method and apparatus for the polishing of diamond surfaces, wherein the diamond surface is subjected to plasma-enhanced chemical etching using an atomic oxygen polishing plasma source, are disclosed. In the apparatus, a magnetic filter passes a plume of high-density, low-energy, atomic oxygen plasma. The plasma is capable of uniformly polishing diamond surfaces.

9 Claims, 5 Drawing Sheets

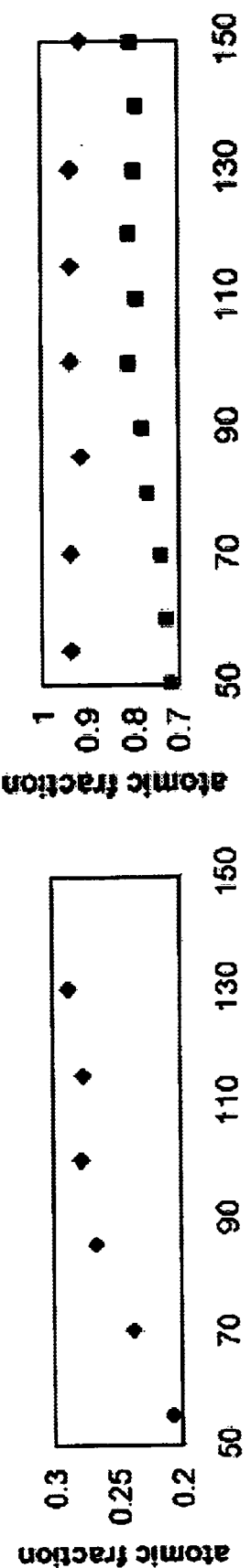
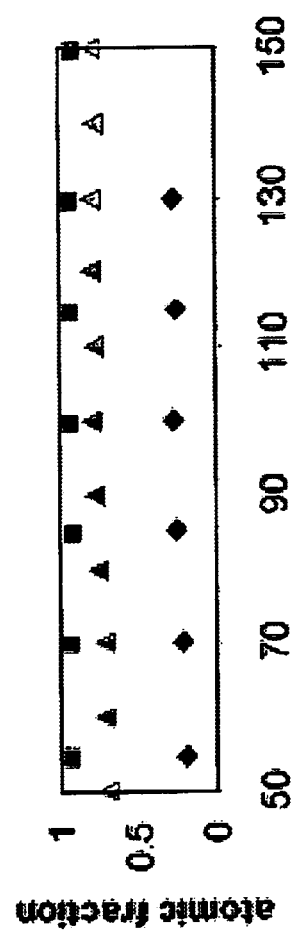
FIG. 4a
FIG. 4b
FIG. 4c $O^+$ = atomic oxygen ions C = diamond oxidation product(s)

METHOD AND APPARATUS FOR LARGE-SCALE DIAMOND POLISHING

FIELD OF THE INVENTION

This invention relates to a method for polishing diamond. More specifically, it relates to the use of plasma-enhanced chemical etching techniques for polishing synthetic diamond to an optical quality surface.

BACKGROUND

Extreme hardness, high thermal and chemical stability, and optical transparency are properties that render diamond desirable in numerous optical, electrical, and military applications. In order to overcome the rarity and cost of natural diamond, synthetic methods of diamond preparation have been developed. Synthetic diamond is efficiently and cost-effectively fabricated in the form of coatings using plasma-assisted (or plasma-enhanced) chemical vapor deposition (PACVD or PECVD) processes. As deposited, the diamond films are polycrystalline, typically possessing a roughness on the order of 10 to 20 micrometers. The rough surface negates the utility of synthetic diamond in many applications, particularly optics. When the as-prepared synthetic diamonds are used as lens coatings, for example, their rough surfaces produce excessive scatter and thus, provide low transmittance. Costly, labor-intensive polishing must be performed in order to achieve the required finish for this type of application. Mechanical polishing techniques utilizing diamond paste are typically performed, but because the synthetic diamond has the same hardness as the diamond in the paste, polishing must be performed repetitively, and for an extended period. As a result, the cost of polishing the diamond to optical quality exceeds the cost of depositing the diamond layer.

To reduce the polishing time and cost, a repetitive ion-implantation mechanical polishing technique was designed and is disclosed in U.S. Pat. No. 5,154,023. When utilizing this technique, the rough diamond surface is first "softened" by the formation of an ion-implanted layer. This softened layer is subsequently subjected to mechanical polishing. The softening and polishing steps are repeated until a desired surface smoothness has been achieved. Each cycle of softening and polishing in this technique affects only a shallow surface layer (on the order of 0.1 microns), so dozens of cycles are necessary to process typical synthetic diamond to optical quality. The repetitive ion implantation polishing technique requires high ion energies (on the order of 100 keV) in order to achieve ion implantation in the diamond surface; this requirement contributes both to overall cost of the method and also raises potential safety issues. Because the synthetic diamond surface has various grain orientations, line-of-sight effects from the high-energy implantation can result in directional sputtering on the surface, thus hampering the production of a smooth surface. In addition, the ion implantation apparatus typically has a small beam spot and therefore, repeated scanning of the beam over the sample is necessary to achieve uniform ion-implantation across the surface of a large synthetic diamond.

Synthetic diamond films and wafers have been used in various microelectronic applications, such as heat sinks or substrates for semiconductor devices. In these applications, it is often desirable to impart a specific architecture on the surface of the diamond. Oxygen plasma, coupled with pattern masking, has been utilized to selectively etch synthetic diamond wafers. Typically, the masked wafer is etched in a low-pressure oxygen gas reactor, using electromagnetic radiation to generate an oxygen plasma. Under these conditions, etching of the diamond wafer is rapid compared to conventional mechanical polishing techniques. However, under these conditions, the etching of the wafer is anisotropic, most likely due to physical bombardment by high-energy molecular oxygen ions, so polishing to optical quality smoothness is not feasible.

SUMMARY

One object of the present invention is to overcome the disadvantages of the methods described above by providing a method for rapid, uniform, and cost-effective synthetic diamond polishing. More specifically, one embodiment of the present invention provides a method of effectively polishing synthetically produced diamond by plasma-enhanced chemical etching using an atomic oxygen polishing plasma source, said source generating high concentrations of low energy atomic oxygen ions over a large surface area. The present invention takes advantage of the ability of low energy atomic oxygen ions to chemically etch a diamond surface at moderate temperatures. Because the atomic oxygen ions have low energy and high density, they conform to the surface of the synthetic diamond sample, and thus polish the sample with increased uniformity versus known oxygen etching techniques. The rate of polishing is proportional to the density of atomic oxygen, and, in the present invention, this density can be easily controlled by adjusting parameters such as gas pressure, discharge voltage, and plasma ion source power to minimize the processing time.

Because the present invention utilizes a chemical effect to polish the diamond surface, the atomic oxygen ions generated are of much lower energy than ions generated for ion implantation techniques or similar high energy beam approaches. Accordingly, the atomic oxygen polishing plasma source disclosed herein can operate at lower voltages than the apparatus for ion-implantation, thereby reducing both capital investment and safety concerns. In addition, because the atomic oxygen polishing plasma source generates a large plume of plasma, large diamond samples can be polished in their entirety without beam scanning, and multiple samples can be polished simultaneously.

BRIEF DESCRIPTION OF THE DRAWINGS

FIG. 4a is a plot of the fraction of atomic oxygen produced by the polishing source as a function of discharge voltage in an embodiment of the present invention without magnetic filtration;

FIG. 4b is a plot of the fraction of atomic oxygen produced by the polishing source as a function of discharge voltage in an embodiment of the present invention having magnetic filtration;

FIG. 4c is an overlay of FIG. 4a and FIG. 4b illustrating the contrast between atomic oxygen concentrations in embodiments of the present invention with and without magnetic filtration.

DETAILED DESCRIPTION

The present invention is useful for providing a method and an apparatus for large scale diamond polishing. The following description is presented to enable one of ordinary skill in the art to make and use the invention, which may be incorporated in the context of a variety of applications. Various modifications to the preferred embodiment, as well as a variety of uses in different applications will be readily apparent to those skilled in the art. Notably, the general principles defined herein may be applied to other embodiments; thus, the present invention is not intended to be limited to the embodiments shown, but is to be accorded the widest scope consistent with the principles and novel features disclosed herein.

Figure 1:
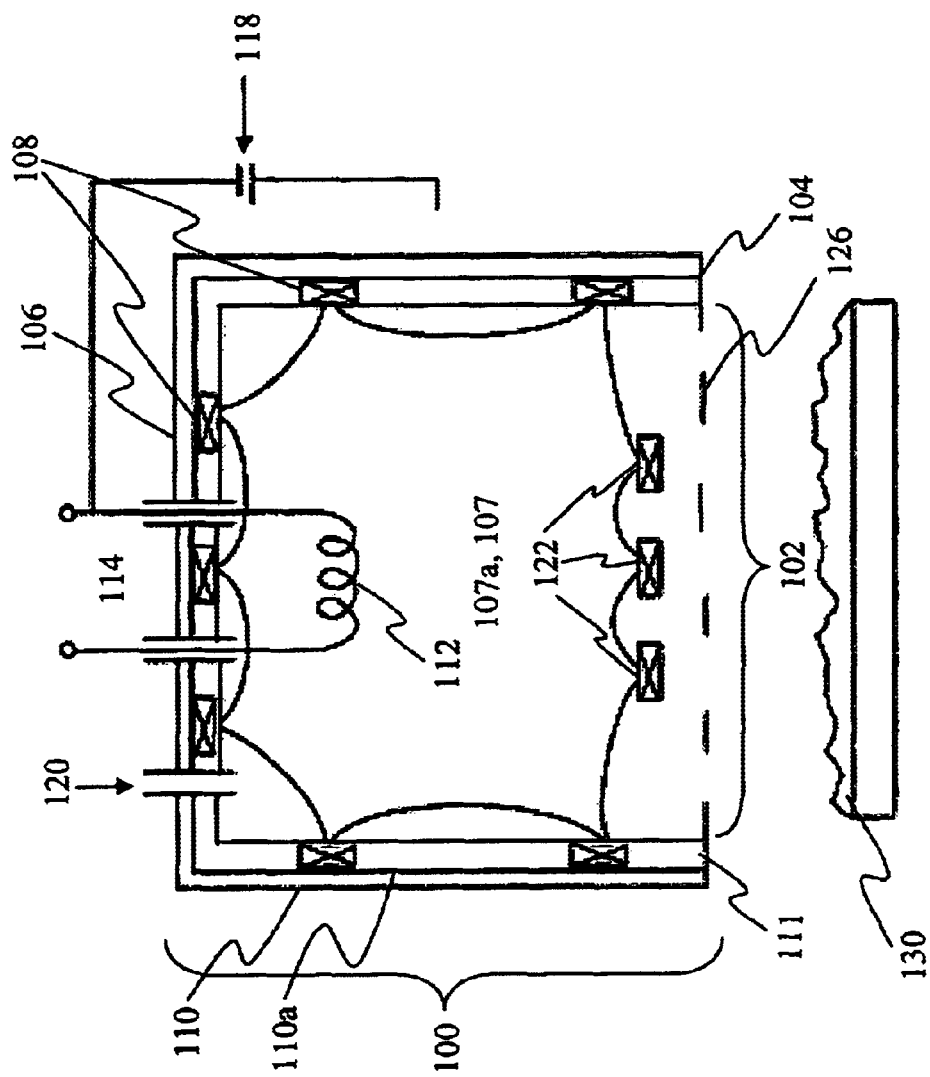
FIG. 1 is a schematic representation of the atomic oxygen polishing plasma source of the present invention.

A schematic of the preferred embodiment of the atomic oxygen polishing plasma source of the present invention is outlined in FIG. 1. The atomic oxygen polishing plasma source 100 is a hollow, cylindrical body having one open end, henceforth referred to as the plasma source exit 102, a wall 104, a closed end 106, and an interior region 107a which forms a reaction chamber 107. The wall 104 and the closed end 106 of the plasma source 100 include a cylindrical array of confinement magnets 108 that are held by their own magnetic fields to the inside surface 110a of a metal cylinder 110 made of a magnetic material such as low carbon steel. A cooling jacket 111 made of a non-magnetic material such as stainless steel completely encases the cylindrical array of confinement magnets 108. The apparatus may optionally also include a shield 132 located between the cooling jacket 111 and the reaction chamber 107 made of an oxidant-resistant material such as molybdenum. An electron source 112, powered by an AC voltage source 114, is inserted through the closed end 106 into the reaction chamber 107 of the plasma source 100. For the purposes of clarity, the electron source will be referred to as a filament. However, it will be obvious to one skilled in the art that other electron sources would be suitable in other embodiments. In addition, the filament electron source 112 and plasma source wall 104 are connected to a DC discharge power supply 118 located outside the plasma source. The plasma source is also equipped with a leak valve or gas port 120 at the closed end 106. A planar array of filtration magnets 122 is located within the plasma source reaction chamber 107, aligned parallel to the plasma source exit 124. A planar transparent electrode grid 126 covers the plasma source exit. The diamond sample, or samples, of interest 130 are placed beyond the plasma source exit 124.

Figure 2:
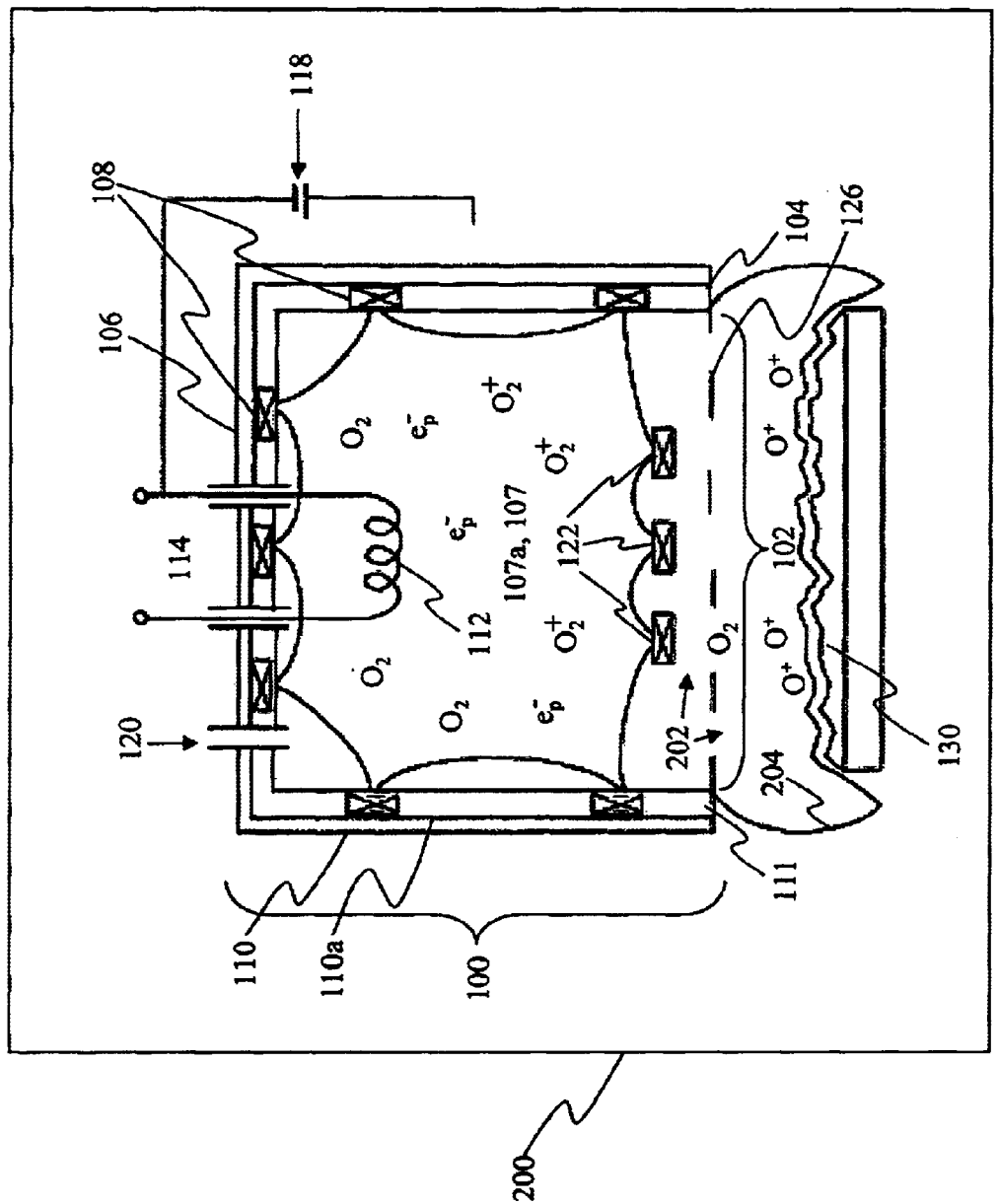
FIG. 2 is a schematic representation of the plasma composition in the different regions of the atomic oxygen polishing plasma source and vacuum chamber of the present invention.

In the preferred embodiment, the atomic oxygen polishing plasma source is positioned inside an evacuated vacuum chamber 200 (shown in FIG. 2). Oxygen gas is introduced into the plasma source 100 through the gas port 120. The final pressure is selected to maximize the atomic oxygen fraction. The pressure in the reaction chamber is the equilibrium pressure created from the flow between the oxygen leak valve, any gaseous reaction products and the vacuum chamber pump. In one embodiment of the present invention a final vacuum chamber pressure of about $10^{-5}$ to $10^{-3}$ Torr provided good results. The electron source filament 112, which in the preferred embodiment is made of tungsten, tantalum, or iridium, is heated to thermionic temperatures, at which point electrons ranging in energy from approximately 10 to 100 eV are emitted from the filament 112. The emitted electrons are the primary electrons. When a DC bias voltage from the DC power supply 118 is applied between the filament 112 and the plasma source wall 104, the primary electrons emitted by the filament are accelerated to the plasma source wall 104. On their way to the plasma source reaction chamber 107, the primary electrons collide with the introduced oxygen molecules, producing primarily molecular oxygen ion plasma and secondary electrons ranging in energy from approximately 0 to 3 eV. During the plasma creation process, the cooling jacket 111 cools the plasma source 100 in order to prevent heating of the confinement magnets 108 and filtration magnets 122 and other potentially destabilizing effects.

Figure 3:
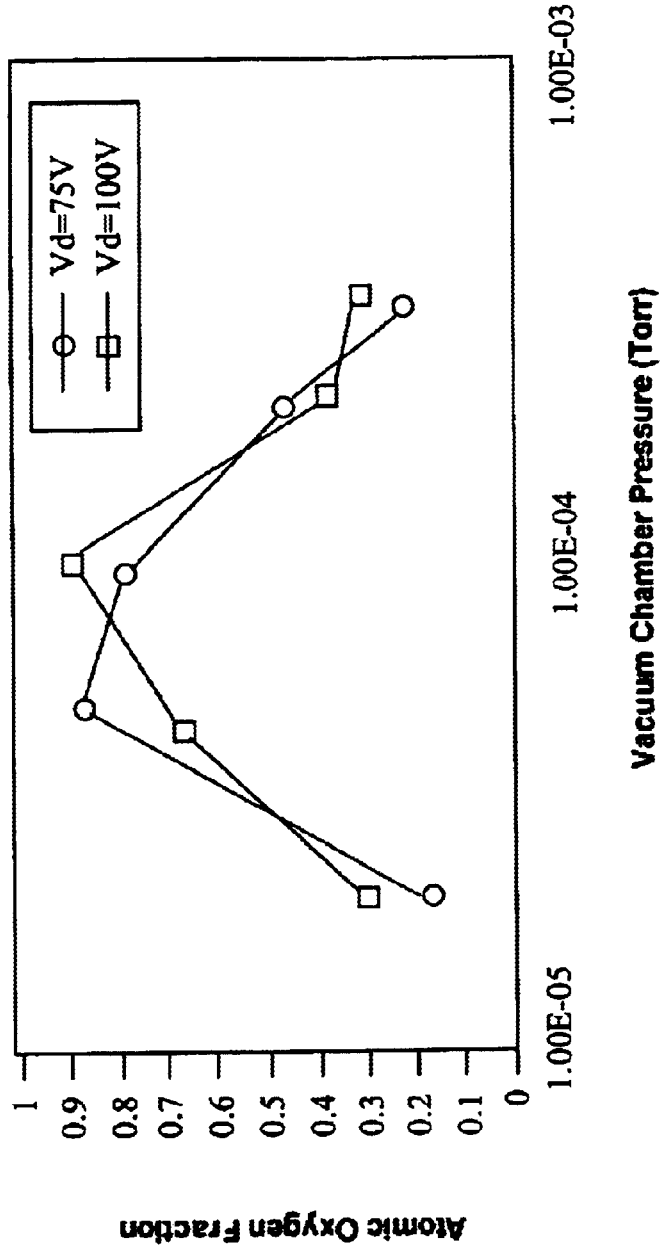
FIG. 3 is a plot of the atomic oxygen fraction as a function of vacuum chamber pressure at two different discharge voltages in the atomic oxygen polishing plasma source of the present invention.

The resultant plasma is comprised of molecular and atomic oxygen species, both neutral and ionic, and free electrons. A schematic of the plasma composition is presented in FIG. 2. Magnetic filtration is used to increase the fraction of atomic ions present in the plasma as follows: The magnetic filter 122 creates a transverse magnetic field in the reaction chamber 107 that prevents the high-energy electrons involved in plasma formation from exiting the plasma source 100. However, low energy electrons and positive ions can penetrate the filter 122 through a collision diffusion mechanism. In the region 202 downstream of the filter 122, the low energy electrons aid in the dissociation of the molecular oxygen ions into atomic ions before the plasma leaves the plasma source 100 as a plume 204 on its way to the diamond surface(s) 130. Dissociation of molecular oxygen ions to atomic ions in the downstream region 202 is dependent on the gas pressure in the vacuum chamber 200. The effect of gas pressure on the fraction of atomic oxygen is shown in FIG. 3.

The effect of magnetic filtration on the fraction of atomic oxygen present in the plasma in the preferred embodiment is illustrated graphically in FIG. 4. As shown in FIG. 4a, the fraction of atomic oxygen in this embodiment is on the order of 0.28. However, as shown in FIG. 4b, the addition of the magnetic filter 122 increases the fraction of atomic oxygen to at least 0.7 and in some cases to over 0.94. An overlay of the atomic oxygen fraction data with and without the magnetic filter 122 is provided in FIG. 4c.

In the preferred embodiment, the plume of plasma 204 generated by the atomic oxygen polishing plasma source 100 is of largely uniform density over approximately 12 cm in diameter at the plasma source exit 124, and broadens with increasing distance from the plasma source exit 124. Thus, with appropriate positioning from the plasma source exit 124, the diamond surface(s) 130 may be completely covered by the atomic oxygen plasma plume 204. Furthermore, because the atomic oxygen ions simply diffuse from the plasma source 100, the energies of these ions are largely dependent on collision effects, which are controlled primarily by gas diffusion and pressure gradients. As a result, the atomic ions in the plasma plume 204 have energies less than about 100 eV, rendering them well-suited to chemically etch a diamond sample 130.

Figure 5:
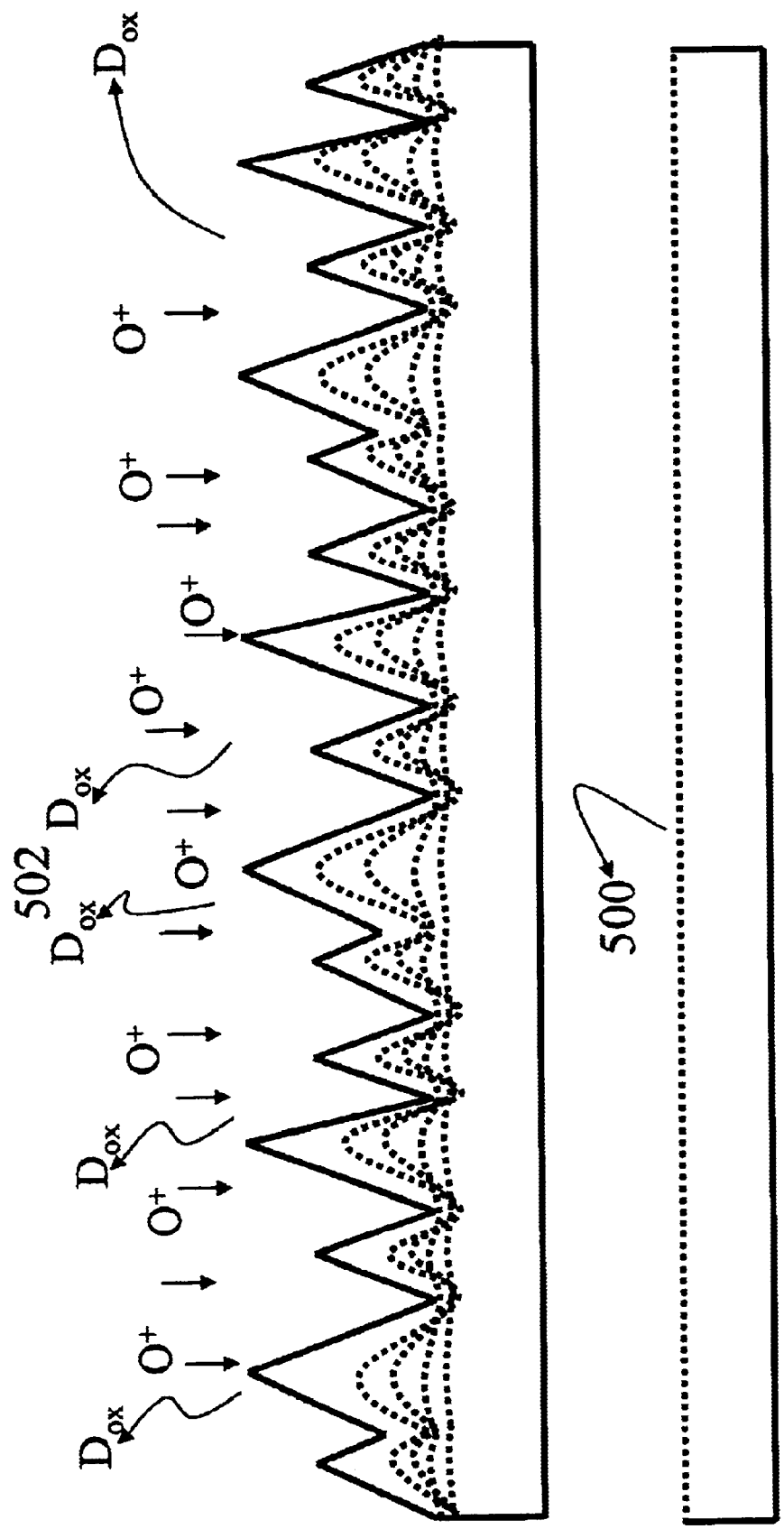
FIG. 5 is a schematic representation of the chemical etching of a diamond surface by atomic oxygen in accordance with the present invention.

The present invention takes advantage of the ability of atomic oxygen to oxidatively chemically etch diamond surfaces. A schematic of the etching mechanism at a diamond surface 500 is provided in FIG. 5. By generating high-density atomic oxygen plasma 502 with magnetic filtration, the atomic oxygen polishing plasma source 100 provides for a rapid reaction rate between the atomic oxygen plasma 502 and the diamond surface 500. The density, and accordingly the reaction rate, in the preferred embodiment of the present invention can be easily controlled by adjusting the gas pressure, the applied discharge power to the plasma source 100, and the power to the electron source 112.

Potential anisotropic effects in diamond polishing are further limited in the present invention by the selective generation of low energy atomic oxygen plasma 502. Restricting the plasma flow to low energy species limits the physical bombardment of the diamond surface 500 by atomic or molecular oxygen ions, a process that results in directional, and accordingly non-uniform, etching of the diamond surface. Under low energy conditions, the primary etching effect on the diamond surface 500 is the non-directional chemical reaction of atomic oxygen 502 with the diamond surface 500. In addition, because the atomic oxygen polishing plasma source generates low energy plasma 502, the safety hazards associated with high energy beams such as utilized in the ion-implantation technique described above are minimized.

Finally, as previously stated, because the diamond is treated in the present invention by a broad plume of plasma 204, it is possible to treat a single large sample in its entirety, or several samples 130 simultaneously. The low-energy, high-density atomic oxygen plasma plume 204 diffusing from the source, while already non-directional in its effect, is applied to the entire sample uniformly to create a smooth, optical quality surface. Thus, the line-of-sight effects characteristic of beam polishing are effectively eliminated.

What is claimed is:

1. A method for polishing diamond surfaces comprising the steps of:
   a. providing a vacuum chamber containing a cylindrical plasma source, where said plasma source comprises:
      i. a magnetic cylinder having a cylindrical chamber formed therein and an open end and a power-source end, with the open end of the cylinder forming a plasma source exit having an exit plane;
      ii. a non-magnetic cooling jacket formed in a substantially annular and cylindrical shape positioned within the cylindrical chamber of the magnetic cylinder;
      iii. a substantially annular and cylindrical array of confinement magnets encased within said non-magnetic cooling jacket, whereby the magnetic cylinder and the array of confinement magnets form a plasma generation reaction chamber;
      iv. an electron source filament connected to an AC power source located outside the magnetic cylinder, said electron source filament being inserted through power-source end of the magnetic cylinder and into the plasma generation reaction chamber;
      v. a gas port inserted through the closed end of the magnetic cylinder and into the plasma generation reaction chamber;
      vi. a DC power source located outside the magnetic cylinder, and connected between the electron source filament and the magnetic cylinder; and
      vii. an array of filtration magnets positioned in the plasma source near the plasma source exit, and parallel to the plasma source exit plane, said array of filtration magnets separating the reaction chamber into an upstream region containing the containment magnets and a downstream region.
   b. introducing oxygen gas into the plasma generation reaction chamber in the magnetic cylinder through the gas port;
   c. applying a DC discharge bias from the DC power source across the plasma generation reaction chamber in the magnetic cylinder to the electron source filament;
   d. heating the filament to thermionic temperatures using the AC power source, causing primary electrons to be emitted therefrom, and to collide with the oxygen gas, producing oxygen plasma including a portion of primary electrons;
   e. passing the oxygen plasma to the plasma source exit through the magnetic filter to prevent primary electrons from entering the downstream region of the reaction chamber;
   f. placing at least one diamond sample, having a surface, in the path of the oxygen plasma exiting through the plasma source exit, said at least one diamond sample remaining in the path of the oxygen plasma until the surface of the diamond sample has optical quality smoothness.

2. A method for polishing diamond surfaces as set forth in claim 1, wherein the discharge voltage applied between the DC power source and the electron source filament is between 20 and 200 volts.

3. A method for polishing diamond surfaces as set forth in claim 1, wherein the discharge voltage applied between the DC power source and the electron source filament is between 50 and 150 volts.

4. A method for polishing diamond surfaces as set forth in claim 1, wherein the pressure of the oxygen gas introduced into the plasma generation reaction chamber in the magnetic cylinder is between $1\times10^{-5}$ and $1\times10^{-3}$ Torr.

5. A method for polishing diamond surfaces as set forth in claim 1, wherein the pressure of the oxygen gas introduced into the plasma generation reaction chamber is between $6.0\times10^{-5}$ and $1.2\times10^{-4}$ Torr.

6. A method for polishing diamond surfaces as set forth in claim 1, wherein the electron source is a filament comprised of a material selected from the group consisting of tungsten, tantalum, and iridium.

7. A method for polishing diamond surfaces as set forth in claim 1, wherein the oxygen plasma is comprised of least 80% atomic oxygen ions.

8. A method for polishing diamond surfaces as set forth in claim 3, wherein the discharge voltage applied between the DC power source and the electron source filament is between 75 and 100 volts.

9. A method for polishing diamond surfaces as set forth in claim 5, wherein the pressure of the oxygen gas introduced into the plasma generation reaction chamber is between $8.0\times10^{-5}$ and $1.0\times10^{-4}$ Torr.

* * * * *